United States Patent
Vaartstra (12) 
(10) Patent No.: US 6,821,341 B2
(45) Date of Patent: Nov. 23, 2004

(54) PRECURSOR FOR USE IN PREPARING LAYERS ON SUBSTRATES

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/908,052

(22) Filed: Jul. 18, 2001

(65) Prior Publication Data

US 2001/0042505 A1 Nov. 22, 2001

Related U.S. Application Data

(63) Continuation of application No. 09/334,153, filed on Jun. 16, 1999, now Pat. No. 6,273,951, and a continuation of application No. 08/720,710, filed on Oct. 2, 1996, now Pat. No. 6,244,575.

(51) Int. Cl.$^7$ .............................................. C30B 25/02
(52) U.S. Cl. ........................... 117/89; 117/99; 117/104; 546/2; 556/112
(58) Field of Search ............................ 117/164, 89, 99; 546/2; 558/112

(56) References Cited

U.S. PATENT DOCUMENTS

| | | |
|---|---|---|
| 4,975,299 A | 12/1990 | Mir et al. |
| 5,124,278 A | 6/1992 | Bohling et al. |
| 5,326,892 A | 7/1994 | Vaartstra |
| 5,453,494 A | 9/1995 | Kirlin et al. |
| 5,677,002 A | 10/1997 | Kirlin et al. |
| 5,679,815 A | 10/1997 | Kirlin et al. |
| 5,744,198 A | 4/1998 | Hampden-Smith et al. |
| 5,772,757 A | 6/1998 | Saito |
| 5,820,664 A | 10/1998 | Gardiner et al. |
| 5,840,897 A | 11/1998 | Kirlin et al. |
| 5,919,522 A | 7/1999 | Baum et al. |
| 5,948,322 A | 9/1999 | Baum et al. |
| 5,980,983 A | 11/1999 | Gordon |
| 5,997,639 A | 12/1999 | Iyer |
| 6,004,392 A | 12/1999 | Isobe et al. |
| 6,030,454 A | 2/2000 | Roeder et al. |
| 6,090,963 A | 7/2000 | Zhuang et al. |
| 6,110,529 A | 8/2000 | Gardiner et al. |
| 6,239,028 B1 | 5/2001 | Vaartstra |
| 6,244,575 B1 | 6/2001 | Vaartstra et al. |
| 6,273,951 B1 | 8/2001 | Vaartstra |
| 6,426,292 B2 | 7/2002 | Vaartstra |

OTHER PUBLICATIONS

Gardiner et al., "Mononuclear Barium Diketonate Polyamine Adducts. Synthesis, Structures, and Use in MOCVD of Barium Titanate", *Chem. Mater.*, 6:1967–1970 (1994).

Gordon et al., "New Liquid Precursors for Chemical Vapor Deposition", MSB Meeting, 6 pp. (Fall 1997).

Versteeg et al., "Metalorganic Chemical Vapor Deposition By Pulsed Liquid Injection Using An Ultrasonic Nozzle: Titanium Dioxide on Sapphire from Titanium (IV) Isopropoxide", *Journal of the American Ceramic Society*, 76:2763–2768 (1995).

"Hawley's Condensed Chemical Dictionary—Thirteenth Edition," Eds. John Wiley & Sons, Inc., p. 756 (1997).

*Primary Examiner*—Robert Kunemund
(74) *Attorney, Agent, or Firm*—Mueting, Raasch & Gebhardt, P.A.

(57) ABSTRACT

A vaporizing apparatus and method for providing a vaporized liquid precursor to a process chamber in a vapor deposition process includes a microdroplet forming device for generating microdroplets from a liquid precursor and a heated housing defining a vaporization zone having a vapor flow path from the microdroplet forming device to the process chamber. The vaporization zone receives the microdroplets and a heated carrier gas. The heated carrier gas has a temperature so as to provide the primary source of heat for vaporizing the microdroplets. The vaporized liquid precursor is then directed to the process chamber from the heated vaporization zone.

28 Claims, 3 Drawing Sheets

PRECURSOR FOR USE IN PREPARING LAYERS ON SUBSTRATES

This is a continuation of application Ser. No. 09/334,153, now U.S. Pat. No. 6,273,951, filed Jun. 16, 1999, which is incorporated herein by reference.

This is also a continuation of application Ser. No. 08/720,710, filed on Oct. 2, 1996, now U.S. Pat. No. 6,244,575 which is incorporated herein by reference in its entirety.

FIELD OF THE INVENTION

The present invention relates to vapor deposition processes and systems. More particularly, the present invention pertains to vaporizers and vaporization methods for vaporizing chemical vapor deposition (CVD) liquid precursors and for providing such vaporized liquid precursors to systems utilizing such methods and vaporizers.

BACKGROUND OF THE INVENTION

Liquid source materials for chemical vapor deposition (CVD) are becoming widely utilized, at least in part due the fact that in many circumstances CVD cannot be accomplished using compounds that are gases at ambient conditions. Liquid sources utilized in CVD include such sources as tetraethoxysilane (TEOS) used as a source of silicon to deposit silicon dioxide films, sources for use and deposit of titanium nitride (TiN) films by CVD, and sources for depositing metal oxides (for example, tantalum oxide, niobium oxide, aluminum oxide, titanium oxide), ferroelectric oxides, copper, and aluminum. Liquid sources used for doping by diffusion are typically organic sources, such as, for example, phosphorus oxychloride, phosphorus tribomide, phosphorus trichloride, and boron tribomide. Further, for depositing doped films by CVD (e.g., borophosphosilicate glass, borosilicate glass, phosphosilicate glass), common liquid sources include, for example, triethylborate, triethylphosphate, triethylphosphite, triisopropyl borate, trimethylborate, trimethylphosphate, and trimethylphosphite. The liquid precursors listed above are listed for illustration only and there are many other liquid precursors too numerous to list. For example, some additional liquid precursors, such as carboxylate complexes, are described in copending utility application Ser. No. 08/720,711, entitled "Method of Depositing Films on Semiconductor Devices" filed on even date herewith and to which the present invention is equally applicable for vaporization and delivery thereof. This copending application is incorporated herein by reference.

Liquid sources are so named because their vapor pressures are so low that they are liquids at room temperature. However, some materials, such as, boron trichloride, have fairly high vapor pressures and are only barely in the liquid state at room temperature. The lower a material's vapor pressure, the more difficult it is to deliver to a CVD reactor or processing chamber. The most commonly used liquid source, TEOS, has a low vapor pressure and many other liquid sources utilized for CVD have even lower vapor pressures. While TEOS can be delivered with existing bubbler technology where a carrier gas, typically nitrogen, is bubbled through the liquid to sweep some of the liquid source molecules into the processing chamber, other liquid precursors, such as precursors for deposition of metal oxide films, due to their lower vapor pressures cannot be delivered with sufficient reproducibility with such bubbler delivery systems, particularly in device applications with small dimensions.

Therefore, there is a need for improvement in conversion of liquid precursors to a vapor and delivery of such vaporized liquid precursors to wafer surfaces. As mentioned above, bubbler delivery systems can be utilized; however, such systems have the disadvantage of having the flow of the liquid precursor indirectly controlled via control of the carrier gas flow bubbled through the liquid precursor. Further, bubblers also have problems in delivering materials with very low vapor pressures which tend to condense or decompose near normal temperatures required for vaporization between the source of the liquid precursor and the processing chamber used for CVD.

Alternatives to conventional bubbler technology, include an approach wherein the liquid source material is heated and vapors are drawn off and controlled by a vapor mass flow controller. Further, another way is to transfer the liquid precursor using either a very precise metering pump or a liquid mass flow controller up to the point where it enters the reaction chamber. At that point, it can either be flash vaporized or injected directly into a mixing chamber and showerhead where it is vaporized. As described in the article entitled, "Metalorganic Chemical Vapor Deposition By Pulsed Liquid Injection Using an Ultrasonic Nozzle: Titanium Dioxide on Sapphire from Titanium (IV) Isopropoxide," by Versteeg, et al., *Journal of the American Ceramic Society*, Vol. 78, No.10, pgs. 2763–68 (1995) a metalorganic CVD process utilizes pulsed on/off liquid injection in conjunction with atomization by an ultrasonic, piezoelectrically driven nozzle to deliver such metalorganic precursors. The pulse injection is said to allow control of film deposition rates, as fine as monolayers per pulse. The ultrasonic nozzle provides a mist of droplets into the processing chamber of a reactor for reproducible vaporization of the liquid precursor. However, such a delivery system performs the vaporization in the processing chamber and thus this delivery system would not be adequate for precursors with only moderate volatility. Such a mist or microdroplets of precursors having only moderate volatility generated by the ultrasonic nozzle would not entirely vaporize prior to contacting the wafer surface in the processing chamber and the CVD film uniformity would not be adequate.

In current systems, where liquid precursors are delivered to a vaporizer using mist generation, vaporization is typically carried out by contact with heated surfaces and then a carrier gas is used to deliver the vaporized liquid precursor to the processing chamber. Such vaporizing devices for delivery systems suffer from the disadvantage of decomposition of the liquid precursors upon contact with the hot surfaces, or incomplete vaporization, which also yields inconsistent films grown under CVD conditions.

For the above reasons, there is a need in the art to provide highly reproducible vaporization of liquid CVD precursors. The present invention as described below improves upon the vaporization process and overcomes the problems described above and other problems which will become apparent to one skilled in the art from the description below.

SUMMARY OF THE INVENTION

A vaporizing apparatus in accordance with the present invention for providing a vaporized liquid to a process chamber in a vapor deposition process includes a microdroplet forming device for generating microdroplets from a liquid precursor. The vaporizing apparatus further includes a heated housing defining a vaporization zone having a vapor flow path from the microdroplet forming device to the process chamber. The vaporization zone receives the microdroplets and heated carrier gas. The heated carrier gas varporizes at least a portion of the microdroplets.

In one embodiment of the invention, the heated carrier gas is an inert gas with high thermal conductivity. Preferably, the heated carrier gas is helium.

In another embodiment of the invention, the heated vaporization zone is physically separate from the process chamber, although in another embodiment the heated vaporization zone may be located at least in part within the process chamber but still physically separate therefrom.

In yet another embodiment of the vaporizing apparatus, the heated housing includes at least one wall. The at least one wall is heated by at least one heating element to maintain a substantially constant temperature along the vapor flow path.

In yet another embodiment, the vaporizing apparatus further includes a detection device for detecting the concentration of unvaporized microdroplets and generating a signal representative thereof. A controller responsive to the signal representative of the detected concentration initiates modification of a parameter of the vaporizing apparatus.

In various other embodiments, the modified parameter of the vaporizing apparatus may include the length of the vapor flow path or further may include changing the temperature of the vapor flow path. In addition, the detection device may be utilized for detecting undesired particulates in the vapor flow path.

A method for vaporizing liquids for vapor deposition processes is also described. The vaporizing method includes generating microdroplets. The microdroplets are then vaporized using a heated carrier gas.

In various embodiments of the method, the heated carrier gas may be any inert gas with high thermal conductivity. Preferably, the heated carrier gas is helium. Further, the microdroplet generating step may include generating the microdroplets electrostatically or ultrasonically.

In another embodiment of the method, the vaporization step is performed in a heated vaporization zone and the vaporization step includes the step of maintaining a substantially constant temperature of the mixture of the heated carrier gas and microdroplets throughout the vaporization zone.

In another embodiment of the method, the concentration of unvaporized microdroplets are detected. The vaporization step is then controlled as a function of the detected concentration. In other embodiments of controlling the vaporization step, the temperature of the heated vaporization zone may be controlled or the time period the microdroplets are in the heated vaporization zone may be controlled.

A vapor deposition system in accordance with the present invention is also described. The system includes a heated carrier gas and a heated housing defining a heated vaporization zone. The heated housing receives the heated carrier gas into the heated vaporization zone. An atomizer for generating microdroplets from a liquid precursor and dispensing the microdroplets in the heated vaporization zone is also a part of the system. The heated carrier gas vaporizes at least a portion of the microdroplets in the vaporization zone. The system further includes a process chamber for receiving the vaporized liquid precursor from the heated vaporization zone.

In one embodiment of the vapor deposition system, the heated vaporization zone is physically separated from the process chamber.

DETAILED DESCRIPTION OF THE EMBODIMENTS

The present invention shall be described with reference to FIG. 1. Various alternative embodiments of the present invention shall be described further with reference to FIGS. 2 and 3. Generally, the vapor deposition system 10 in accordance with the present invention includes a liquid CVD precursor vaporizer 12 that delivers a vaporized liquid precursor to process chamber 14.

The present invention provides a highly reproducible vaporization of liquid precursors for CVD processes. The vaporizer converts the liquid precursor, e.g. a single liquid compound, a mixture of liquid compounds, or a solution including one or more solutes dissolved in one or more compatible solvents, into vapor phase species which are suitable for CVD. Particularly, the present invention allows for the use of a liquid precursor that is sensitive to decomposition near the normal temperatures required for vaporization, and for which standard bubbler type delivery would most likely be inadequate.

Generally, the vaporization of the liquid precursor is carried out in two stages. First, the liquid precursor is atomized or nebulized generating high surface area microdroplets or mist. In the second stage, the constituents of the microdroplets or mist are vaporized by intimate mixture of the heated carrier gas. This two stage vaporization approach provides a reproducible delivery for liquid precursors and provides reasonable growth rates, particularly in device applications with small dimensions.

Moreover, the liquid precursor vaporizer 12 in accordance with the present invention performs the liquid precursor vaporization employing high surface area microdroplets and low residence times within a vaporization zone as will be described further below. Such high surface area and lower residence times alleviate problems associated with decomposition of liquid precursors upon contact with heated surfaces in the vaporization process.

Figure 1:
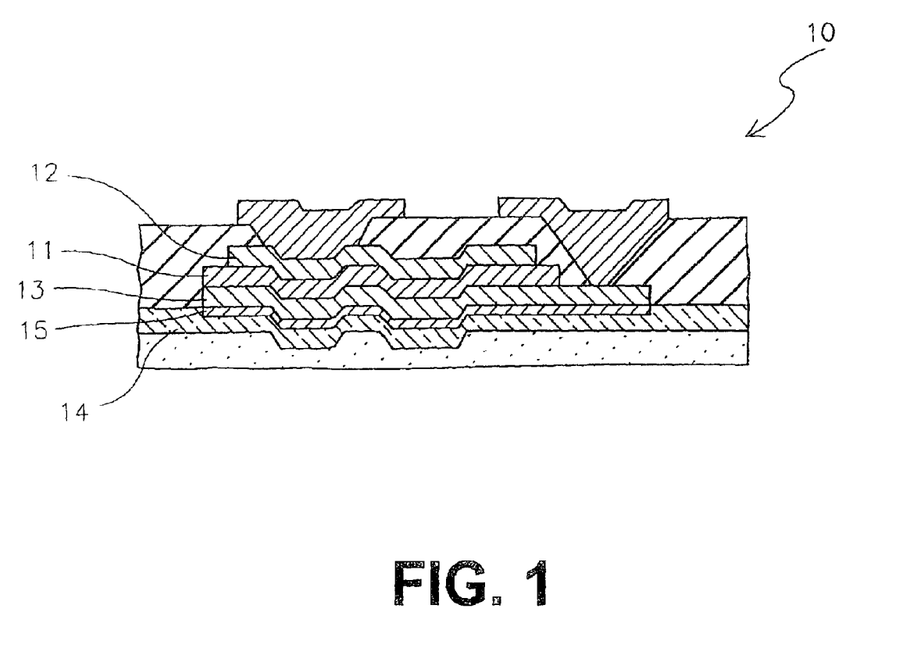
FIG. 1 is a block diagram illustration of a vapor deposition system including a liquid CVD precursor vaporizer in accordance with the present invention.

As shown in FIG. 1, vapor deposition system 10 includes the liquid CVD precursor vaporizer 12 and process chamber or reaction chamber 14. The present invention may be utilized with various CVD process chambers or reaction chambers including, but not limited to, hot wall or cold wall reactors, atmospheric or reduced pressure reactors, as well as plasma enhanced reactors. Further, the present invention is advantageous for vaporization and delivery of many different liquid precursors to a process chamber in the CVD process and is not limited to any particular liquid precursor but is limited only in accordance with the invention as described in the accompanying claims.

The liquid precursor vaporizer 12 includes a heated vaporization zone 20 defined by housing 22. The heated vaporization zone 20 includes a vapor flow path from a microdroplet generating device or atomizer 30 to the process chamber 14. The heated housing 22 includes at one end a directing device 50 for directing the vaporized liquid precursor into the process chamber 14. The directing device may include any known means of directing the vaporized liquid precursor from the vapor flow path into the process chamber 14. As shown in FIG. 1, the directing device includes a showerhead 50.

The microdroplet generating device or atomizer 30 generates high surface area microdroplets, for example, droplets of approximately 20 micrometers in diameter. The atomizer 30 may include an ultrasonic nebulizer such as that available from Sono-Tek Corp., Poughkeepsie, N.Y. or Sonics & Materials, Inc., Danbury, Conn. The ultrasonic nebulizer, as is known to one skilled in the art, includes, for example, a nozzle 36 containing piezoelectric transducers that create standing vibrations along the nozzle body to generate droplets or mist for dispensing through a tip of the nozzle.

Alternatively, the atomizer 30 may include an electrostatic sprayer, such as that available from Binks, Franklin Park, Ill. The electrostatic sprayer, as is known to one skilled in the art, generates the droplets for dispensing into the vaporization zone using electrostatic charge to separate the liquid precursor into droplets. Further, the mist or microdroplets may also be created utilizing a forced gas, or in other words, a bubbler that produces the fine mist of microdroplets utilizing a series of baffles to obtain the high surface area microdroplet.

Preferably, the atomizer 30 is either an electrostatic or an ultrasonic nebulizer. However, any atomizer 30 capable of providing microdroplets adequate for vaporization in the vaporization zone 20 of the present invention may be utilized. The dimension of microdroplets adequate for vaporization depends upon the liquid precursor utilized, the temperature of the heated carrier gas, whether the liquid precursor is preheated prior to dispersement into the vaporization zone, the vapor pressure of components in the liquid precursor, and the decomposition temperatures of the components of the liquid precursor. The example of a microdroplet having approximately a 20 micrometer diameter is for illustrative purposes only. Generally, a microdroplet may be defined as any droplet having a mean diameter less than about 1000 micrometers in diameter. However, preferably the diameter is less than 100 micrometers in diameter for providing a higher surface area for vaporization.

The atomizer 30 is provided with a liquid precursor by a flow controller or liquid pump 32. Any flow controller, such as, for example, commonly available mass flow controllers, that provide a flow of liquid precursor to the atomizer 30 in a reproducible fashion may be utilized. The liquid precursor 34 provided to the atomizer 30 may be a single liquid compound or a mixture of chemically compatible compounds that result in liquid state. Further, the liquid precursor 34 may be a solution of one or more solutes dissolved in one or more compatible solvents. For such solutes, the solvent can be any liquid which dissolves the solute and does not react with it to yield a compound of undesirable physical properties for the CVD process. The flow controller or liquid pump 32 may be controlled to provide a greater or lesser flow rate of the liquid precursor to atomizer 30 to control the vaporization process and the deposition rate in the CVD process. Various precursors may be utilized. For example, such precursors may be the carboxylate complexes, described in copending utility application Ser. No. 08/720, 711, entitled "Method of Depositing Films on Semiconductor Devices" filed on even date herewith and to which the present invention is applicable for vaporization and delivery thereof. This copending application is incorporated herein by reference. The vapor deposited film on substrate or wafer 15 is deposited using the desired liquid precursor or ratio of precursors that will yield the desired film composition.

The nozzle 36 of atomizer 30 is sealingly positioned with its open end tip extending into the vaporization zone 20. The nozzle 36 may be in a fixed position or the nozzle 36 may be in a variable position for movement within the vaporization zone 20 such as by a drive mechanism. Such a variably positioned nozzle may be utilized to change the length of the vapor flow path in order to decrease or lengthen the residence time of the microdroplets or mist 46 in the vaporization zone 20.

Heated carrier gas 44 is provided to the heated vaporization zone 20 through port 45 and by way of a heated gas line 24. The heated gas line includes heating elements 28 thereabout for heating the line 24. The heated carrier gas may be any inert gas such as, for example, helium, nitrogen, or argon. Preferably, the heated gas 44 is helium which includes a high thermal conductivity for providing the primary source of heat to vaporize the microdroplets from atomizer 30.

The gas is heated by a gas heater 42 and the flow of the heated gas is controlled by flow controller 40. Flow controller 40 may be any flow controller, such as, for example, commonly available mass flow controllers, that provide a flow of gas to the vaporization zone in a reproducible fashion where it is intimately mixed with the microdroplets 46 from atomizer 30. The heated carrier gas is of a temperature so as to be the primary source of heat for vaporizing the microdroplets 46. For example, depending upon the necessary heat required for vaporizing the microdroplets, the helium gas may be of a temperature in the range of about −10° C. to about 500° C., preferably from about 30° C. to about 250° C. The temperature of the heated carrier gas will also vary depending upon the temperature of the liquid precursor, which will typically vary from about 10° C. to about 100° C., and any other applicable vaporization process parameters, such as flow rates, etc.

The microdroplets 46 will come into contact with the heated carrier gas 44 for flash vaporization by the heated carrier gas 44 in the vaporization zone 20. Every microdroplet should be in intimate contact with the heated carrier gas 44 for instantaneous heating and vaporization thereof. The vaporization zone 20 allows for sufficient residence time to complete vaporization before the components of the liquid precursor are carried into the CVD process chamber 14.

The heated housing 22 defines the heated vaporization zone 20 and includes walls 27 heated by heating elements 26 to maintain the temperature of the carrier gas and liquid precursor microdroplet mixture to a temperature that deters condensation of the liquid precursor on the walls 27 of the heated housing 22. Further, the flow rate of the heated carrier gas 44 is controlled by the flow controller 40 so as to provide a sufficient flow rate to also keep the precursor from decomposing on the walls 27 of the heated housing 22. The flow rate of the heated carrier gas 44 under the control of flow controller 40 also provides control of the residence time of the microdroplets within the heated vaporization zone 20.

The heated vaporization zone 20 is controlled to maintain a substantially constant temperature along the vapor flow path extending from the atomizer to the process chamber. The heated vaporization zone 20 may include one or more temperature sensors for detecting the temperature along the vapor flow path and providing such information to a controller (not shown) for controlling the temperature of one or more heating elements 26 or zones along the housing walls 27. Further, such temperature information may be utilized for altering the temperature of the heated carrier gas by adjusting the gas heater 42.

The carrier gas port 45 in housing 22 is positioned in close proximity to nozzle 36 to provide for adequate mixing of the heated carrier gas 44 and the microdroplets 46. As the heated carrier gas 44 is mixed with the microdroplets 46, the microdroplets are vaporized. The heated vaporization zone 20 as a result of heating elements 26 of heated housing 22 provides for a secondary heat source. However, such secondary heat source does not provide the primary source of heat for vaporization but rather provides for maintaining the temperature along the vapor path of the heated vaporization zone to deter condensation of the liquid precursor.

As shown in FIG. 1, the heated carrier gas port 45 is provided in close proximity to the nozzle 36 of atomizer 30 and the microdroplets 46 are mixed with heated carrier gas 44 in the vaporization zone 20. However, as shown with reference to FIG. 2, the mixture of the precursor mist or microdroplets 46 and the heated carrier gas 44 may be performed in other manners and with other configurations such as for example, providing the microdroplets directly to the heated gas line from nozzle 94 of an atomizer. In this configuration, the heated carrier gas 44 would be mixed with the microdroplets 46 as they enter the vaporization zone which extends from the atomizer to the process chamber. It should be readily apparent to one skilled in the art, that other configurations, for example, such as providing a heated carrier gas line directly at the tip of the nozzle, may also be utilized in accordance with the present invention.

Figure 2:
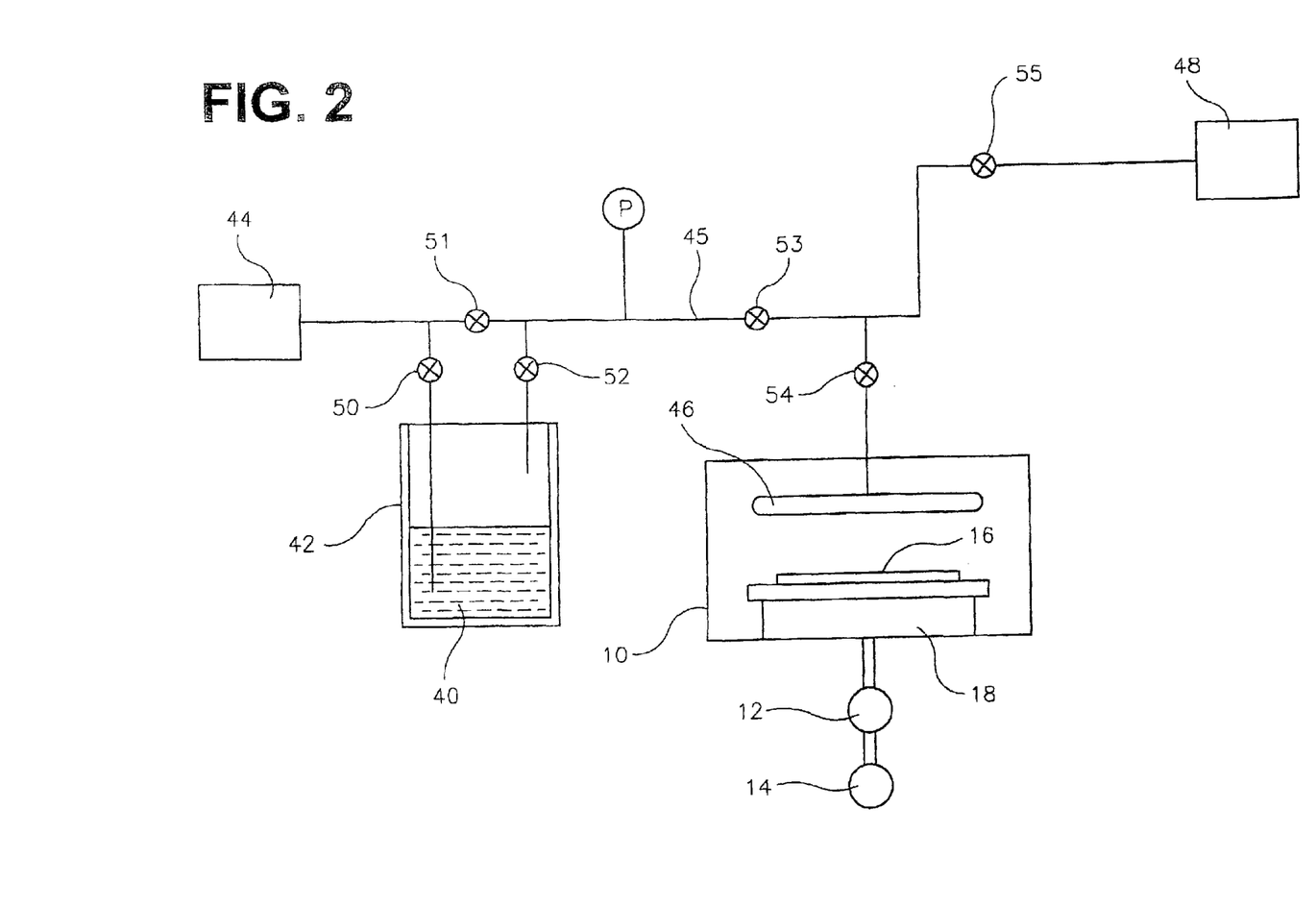
FIG. 2 is an alternative block diagram illustration of a portion of the liquid CVD precursor vaporizer in accordance with the present invention.

Further as shown in the alternative configuration of FIG. 2, it may be beneficial to reverse the position of the flow controller and gas heater of FIG. 1 to rather provide a flow controller 92 for controlling the flow rate of the carrier gas 44 and then providing the heating of the gas 44 via block 90. In such a configuration, it is then unnecessary to heat the elements of the flow controller 40 in order to maintain the constant temperature of the heated carrier gas 44 along the heated gas line 98 for reproducibility of the heated carrier gas 44 into the vaporization zone 20. The proximity of the gas heater to the vaporization zone should also be minimized.

As would be apparent to one skilled in the art, the heated vaporization zone 20 may be directed into one or more process chambers by one or more directing devices 50, such as, for example, the showerhead 50 of the FIG. 1. For example, two liquid precursor vaporizers 12 may be utilized for directing a vaporized liquid precursor into a single process chamber or, for example, a single heated vaporization zone with multiple directing devices 50 may be utilized for directing the vaporized liquid into several process chambers 14.

Also, as would be apparent to one skilled in the art, other reactants or reactant gases may be introduced in the vapor deposition system 10 in various manners and at various points in the system. For example, reactants or reactant gases, such as, for example, oxygen, nitrous oxide, ammonia, water vapor, hydrogen sulfide, hydrogen selenide, hydrogen telluride, etc., and mixtures thereof, can be introduced into the process chamber 14 separately from the vaporized liquid precursor, introduced into the system in combination with the liquid precursor being vaporized, introduced into the system in combination with the heated carrier gas, introduced into the vaporization zone to combine with the vaporized liquid precursor, or in any combination thereof.

Figure 3:
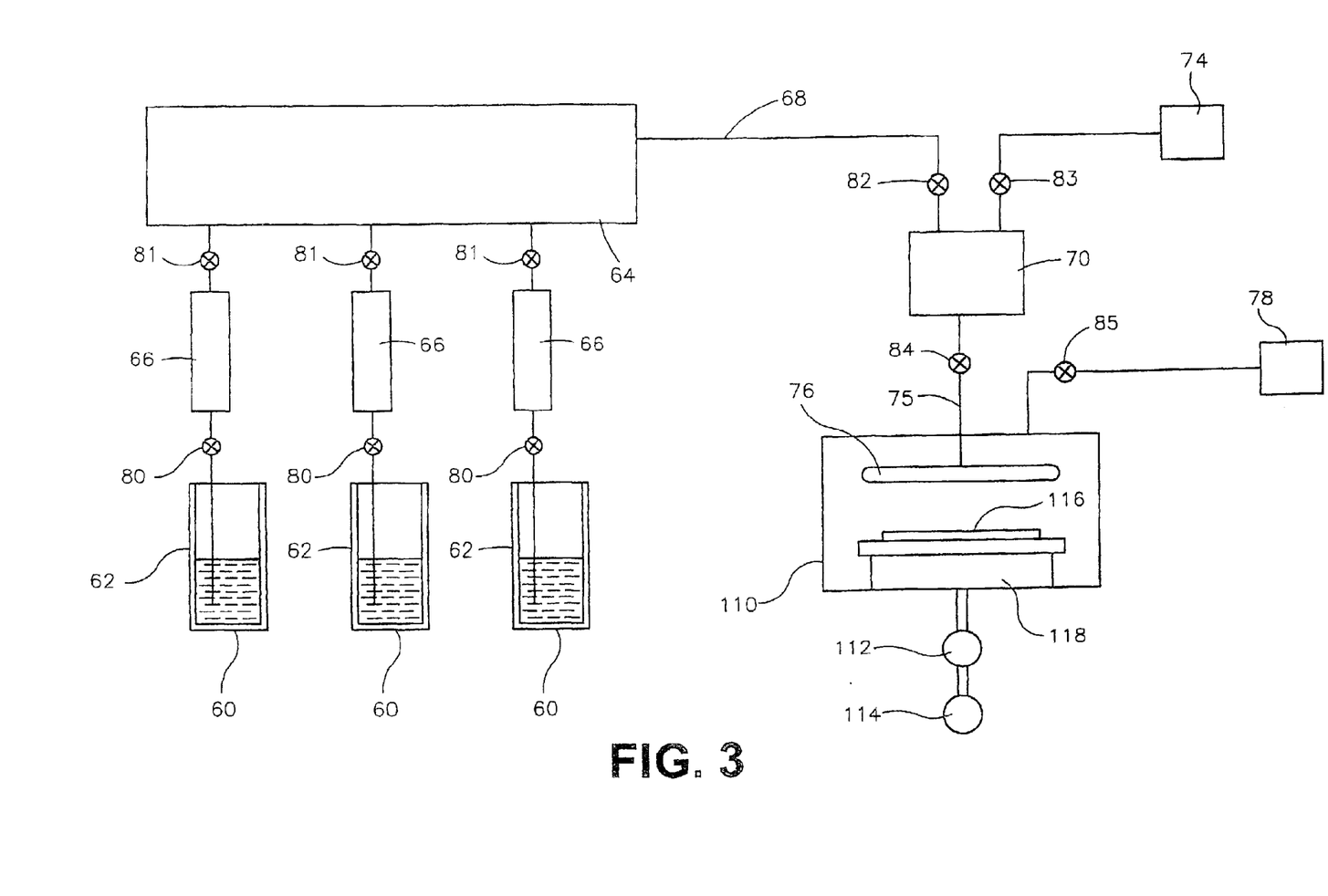
FIG. 3 includes a further alternative embodiment of the vaporizer including a detection and feedback system in accordance with the present invention.

The embodiment of FIG. 3 includes all the elements of embodiment of FIG. 1 and further includes a detection system 105 which may be utilized to detect unvaporized mist or microdroplets or to detect particulates that would be detrimental to the growth of a film in the process or reactor chamber 116. The detected information may then be supplied to a controller 112 for manipulating the liquid precursor vaporizer 12 via a feedback loop. The feedback is utilized to adjust the temperature or adjust the residence time of the mixture of heated carrier gas 44 and microdroplets 46 in heated vaporization zone 20.

With reference to FIG. 3, the detection system 105 includes a diverter 102 for diverting the vaporized microdroplets to a flow cell 104. The flow cell 104 includes a window for hitting the diverted vaporized and unvaporized microdroplets with a laser light from a laser source 108, such as a laser diode. Light scattered by the diverted sample is detected by a detector 110, for example, a photodiode. The detector 110 then generates an electrical signal and provides a signal to controller 112 indicating the concentration of the unvaporized microdroplets or detected particulates that would be detrimental to the CVD process.

Alternatively, the process chamber may be used as the flow cell. Rather than diverting a sample of the vaporized microdroplets into flow cell 104, the detection system 105 may include a window for impinging on the vaporized and unvaporized microdroplets in the process chamber 116 with a detector 118 for detecting the light scattered by the constituents in the process chamber. The detection system may also be performed at any in-line point of the vaporization process or vaporization zone where desired, although because the vaporization zone is to be continuously maintained at a constant temperature, diversion to a flow cell separated from the vaporization zone may provide the simplest configuration. Such detection systems may include elements or systems from commonly available concentration detection systems as are known to those skilled in the art, such as those available from Alltech, Deerfield, Ill.

The controller 112 which controls the liquid precursor vaporizer 12 in response to detected concentrations, can provide such control in various ways. The nozzle 36 of atomizer 30 may be variably positioned, as previously described, within the heated vaporization zone 20 so as to allow the tip of the nozzle to be moved within the vaporization zone 20. This would allow the controller to adjust the length of the vapor flow path using the position of the nozzle and thus adjust the residence time of the microdroplets 46 and heated carrier gas 44 within the heated vaporization zone 20.

In another embodiment, the control may be accomplished by having the housing 22 being telescoped such that the length of the housing 22 may be modified to vary the length of the vapor flow path of the heated vaporization zone 20. This once again, will adjust the residence time of the microdroplets 46 and heated carrier gas 44 within the heated vaporization zone 20. In addition, the flow rate of the heated carrier gas 44 under control of the flow controller 40 may be utilized to adjust the residence time of the heated carrier gas 44 and microdroplets 46 within the heated vaporization zone 20. As would be apparent to one skilled in the art, any structural variability which may modify the length of the heated vaporization zone 20 could be utilized for providing control of residence time in response to detected unvaporized precursor.

The vaporizer 12 may also be adjusted by adjusting the temperature in various ways. For example, the temperature of the heated gas 44 by way of gas heater 42 may be adjusted to provide more adequate vaporization within heated vaporization zone 20. In addition to adjusting the temperature of the heated carrier gas 44, the temperature of the heated vaporization zone 20 may be modified by adjusting the temperature of heating elements 26 to more effectively vaporize the microdroplets 46 within the heated vaporization zone 20. Again, as one skilled in the art would recognize, any temperature modification available within the liquid precursor vaporizer 12 could be controlled for providing more adequate vaporization of the microdroplets 46 within the heated vaporization 20 in response to the detection of unvaporized liquid precursor.

The atomizer 30 may also include a preheating element which preheats the liquid precursor prior to dispensing it into vaporization zone 20. By preheating the liquid precursor, the temperature of the heated carrier gas 44 may be decreased or the residence time within the heated vaporization zone 20 may be shortened. This preheating element may also be controlled in response to the detection of unvaporized liquid precursor.

As would be known to one skilled in the art, the orientation, i.e., vertical/horizontal, of the various elements of the vaporizer 12 including the directing device 50 may take one of any number of configurations. For example, the vaporization zone may be vertical as opposed to being horizontal, the heated carrier gas line may be vertical as opposed to being horizontal, the showerhead may be positioned such that the vapor is directed upward as opposed to being directed downward, as well as other changes in the configuration as would be known to one skilled in the art.

Also, as would be known to one skilled in the art, the ranges of residence time within the vaporization zone and the heat necessary to vaporize the microdroplets 46 is highly dependent upon the liquid precursor utilized. Each liquid precursor will have different ranges of such parameters and other applicable parameters. Because the invention as described herein is not limited to any particular liquid precursor, the time ranges with regard to residence time and heat necessary to vaporize such liquid precursors is variable depending on the application of the apparatus.

The vaporization method in accordance with the present invention includes generating high surface area microdroplets, for example, with atomizer 30. Then such microdroplets are vaporized using a heated carrier gas, such as helium, as the primary source of heat for such vaporization. The present invention employs a high surface area with a low residence time within the vaporization zone to provide vaporization of a liquid precursor utilizing a heated carrier gas as opposed to the vaporization being carried out by contact with heated surfaces. The heated carrier gas is utilized as the primary source of heat for the vaporization and is also utilized to deliver the liquid precursor to the process chamber 14. The vaporization of the liquid precursor is performed in a heated vaporization zone which is physically separated from the process chamber 14, although it may be at least in part positioned within the process chamber 14.

As previously described, the high surface area microdroplets may be generated by an electrostatic sprayer, an ultrasonic nebulizer or aspirated using a forced gas or bubbler technique with baffles. The microdroplets are dispensed into the heated vaporization zone 20, such as through nozzle 36 of atomizer 30. The heated carrier gas 44 is mixed with the microdroplets in the heated vaporization zone 20. The mixing may take place, for example, directly upon entering the heated vaporization zone 20 such as when the microdroplets are provided directly to the carrier gas line 24.

In order to prevent decomposition of the microdroplets at the heated walls, the heated carrier gas 44 is provided to the vaporization zone 20 at a flow rate that prevents the microdroplets from sticking to the heated wall surfaces of the housing 22. Further to prevent decomposition of the mixture of heated carrier gas 44 and microdroplets 46, a substantially constant temperature of the mixture is maintained throughout the vaporization zone and along the vapor flow path.

After the mixture of heated carrier gas 44 and microdroplets 46 proceeds along the vapor flow path of the heated vaporization zone 20, the vaporized liquid precursor is directed to one or more process chambers 14 for use in depositing a desired film, such as on the deposition surface or wafer 15.

The detection system 105 providing feedback to various elements of the vaporizer 12, as described previously, provides additional control of the process in order to provide highly reproducible vaporization.

Although the present invention has been described with particular reference to a preferred embodiment thereof, variations and modifications of the present invention can be made within a contemplated scope of the following claims as is readily known to one skilled in the art.

What is claimed is:

1. A method of manufacturing a semiconductor structure comprising:

providing a semiconductor substrate or substrate assembly;

providing a precursor composition comprising two or more complexes of the formula:

$$L_yMY_z$$

wherein:

M is a metal;

each L group is independently a neutral ligand containing one or more Lewis-base donor atoms;

each Y group is independently an anionic ligand;

y=a nonzero integer; and z=a nonzero integer corresponding to the valence state of the metal; and further wherein there are at least two different L groups present in the precursor composition; and vaporizing the precursor composition and directing it toward the semiconductor substrate or substrate assembly to form a metal-containing layer on a surface of the semiconductor substrate or substrate assembly.

2. The method of claim 1 wherein the precursor composition is vaporized in the presence of a carrier gas.

3. The method of claim 2 wherein the precursor composition is vaporized in the presence of a reaction gas.

4. The method of claim 3 wherein:

the carrier gas is selected from the group consisting of nitrogen, helium, argon, and mixtures thereof; and the reaction gas is selected from the group consisting of oxygen, ozone, nitrogen oxides, ammonia, hydrazine, water vapor, hydrogen sulfide, hydrogen selenide, hydrogen telluride, and mixtures thereof.

5. The method of claim 4 wherein the layer is a layer of an oxide, sulfide, nitride, selenide, telluride, or mixture thereof.

6. The method of claim 1 wherein the layer is an oxide layer and forms a dielectric layer.

7. The method of claim 1 wherein the precursor composition further includes one or more solvents.

8. The method of claim 1 wherein vaporizing the precursor composition comprises using a chemical vapor deposition technique comprising flash vaporization, bubbling, microdroplet formation, or combinations thereof.

9. The method of claim 1 wherein the metal is selected from the group of the Group IA metals, Group IIA metals, the Group IVB metals, the Group VA metals, and the Group VB metals.

10. The method of claim 1 wherein the metal is a lanthanide.

11. The method of claim 1 wherein the Lewis-base donor atoms are selected from the group of O, S, N, P, As, Se, and halogen.

12. The method of claim 1 wherein the layer is an oxide, sulfide, nitride, selenide, telluride, or mixture thereof.

13. The method of claim 1 wherein the metal is selected from the group of the Group IA metals, Group IIA metals, the Group IVB metals, the Group VA metals, and the Group VB metals; and the Lewis-base donor atoms are selected from the group of O, S, N, P, As, Se, and halogen.

14. The method of claim 1 wherein the neutral ligand L is selected from the group of polyamines, polyethers, aminoalcohols, ether-alcohols, and mixtures thereof.

15. The method of claim 1 wherein the anionic ligand Y is selected from the group of carboxylates, ketoiminates, amidinates, diketonates, diiminates, and mixtures thereof.

16. A method of manufacturing a semiconductor structure comprising:
providing a semiconductor substrate or substrate assembly;
providing a precursor composition comprising two or more complexes of the formula:

$$L_yMY_z$$

wherein:
M is a metal selected from the group of the Group IA metals, Group IIA metals, the Group IVB metals, the Group VA metals, and the Group VB metals;
each L group is independently a neutral ligand selected from the group of polyamines, polyethers, aminoalcohols, ether-alcohols, and mixtures thereof;
each Y group is independently an anionic ligand selected from the group of carboxylates, ketoiminates, amidinates, diketonates, diiminates, and mixtures thereof;
y=a nonzero integer; and
z=a nonzero integer corresponding to the valence state of the metal; and
further wherein there are at least two different L groups present in the precursor composition; and
vaporizing the precursor composition and directing it toward the semiconductor substrate or substrate assembly to form a metal-containing layer on a surface of the semiconductor substrate or substrate assembly.

17. A method of manufacturing a memory device structure comprising:
providing a substrate having a first electrode thereon;
providing a precursor composition comprising two or more complexes of the formula:

$$L_yMY_z$$

wherein:
M is a metal;
each L group is independently a neutral ligand containing one or more Lewis-base donor atoms;
each Y group is independently an anionic ligand;
y=a nonzero integer; and
z=a nonzero integer corresponding to the valence state of the metal; and
further wherein there are at least two different L groups present in the precursor composition;
vaporizing the precursor composition and directing it toward the substrate to form a dielectric layer comprising an oxide layer on the first electrode of the substrate; and
forming a second electrode on the dielectric layer.

18. The method of claim 17 wherein the substrate is a silicon wafer.

19. The method of claim 17 wherein the oxide layer forms a ferroelectric layer.

20. A method of manufacturing a memory device structure comprising:
providing a substrate having a first electrode thereon;
providing a precursor composition comprising two or more complexes of the formula:

$$L_yMY_z$$

wherein:
M is a metal selected from the group of the Group IA metals, Group IIA metals, the Group IVB metals, the Group VA metals, and the Group VB metals;
each L group is independently a neutral ligand selected from the group of polyamines, polyethers, aminoalcohols, ether-alcohols, and mixtures thereof;
each Y group is independently an anionic ligand selected from the group of carboxylates, ketoiminates, amidinates, diketonates, diiminates, and mixtures thereof;
y=a nonzero integer; and
z=a nonzero integer corresponding to the valence state of the metal; and
further wherein there are at least two different L groups present in the precursor composition;
vaporizing the precursor composition and directing it toward the substrate to form a dielectric layer comprising an oxide layer on the first electrode of the substrate; and
forming a second electrode on the dielectric layer.

21. A method of forming a layer on a substrate comprising:
providing a substrate;
providing a precursor composition comprising two or more complexes of the formula:

$$L_yMY_z$$

wherein:
M is a metal;
each L group is independently a neutral ligand containing one or more Lewis-base donor atoms;
each Y group is independently an anionic ligand;
y=a nonzero integer; and
z=a nonzero integer corresponding to the valence state of the metal; and
further wherein there are at least two different L groups present in the precursor composition; and
vaporizing the precursor composition and directing it toward the substrate to form a metal-containing layer on the substrate.

22. The method of claim 21 wherein the layer is a layer of an oxide, sulfide, nitride, selenide, telluride, or mixture thereof.

23. The method of claim 22 wherein the layer is an oxide layer.

24. The method of claim 23 wherein the oxide layer forms a ferroelectric layer in a ferroelectric memory device.

25. The method of claim 24 wherein the substrate comprises a silicon substrate.

26. A method of forming a layer on a substrate comprising:
providing a substrate;
providing a precursor composition comprising two or more complexes of the formula:

$$L_yMY_z$$

wherein:
M is a metal selected from the group of the Group IA metals, Group IIA metals, the Group IVB metals, the Group VA metals, and the Group VB metals;
each L group is independently a neutral ligand selected from the group of polyamines, polyethers, aminoalcohols, ether-alcohols, and mixtures thereof;
each Y group is independently an anionic ligand selected from the group of carboxylates, ketoiminates, amidinates, diketonates, diiminates, and mixtures thereof;
y=a nonzero integer; and
z=a nonzero integer corresponding to the valence state of the metal; and
further wherein there are at least two different L groups present in the precursor composition; and
vaporizing the precursor composition and directing it toward the substrate to form a metal-containing layer on the substrate.

27. A chemical vapor deposition precursor composition comprising two or more complexes of the formula:

$$L_yMY_z$$

wherein:
M is a metal;
each L group is independently a neutral ligand containing one or more Lewis-base donor atoms;
each Y group is independently an anionic ligand;
y=a nonzero integer; and
z=a nonzero integer corresponding to the valence state of the metal; and
further wherein there are at least two different L groups present in the precursor composition.

28. A chemical vapor deposition precursor composition comprising two or more complexes of the formula:

$$L_yMY_z$$

wherein:
M is a metal selected from the group of the Group IA metals, Group IIA metals, the Group IVB metals, the Group VA metals, and the Group VB metals;
each L group is independently a neural ligand selected from the group of polyamines, polyethers, aminoalcohols, ether-alcohols, and mixtures thereof;
each Y group is independently an anionic ligand selected from the group of carboxylates, ketoiminates, amidinates, diketonates, diiminates, and mixtures thereof;
y=a nonzero integer; and
z=a nonzero integer corresponding to the valence state of the metal; and
further wherein there are at least two different L groups present in the precursor composition.

* * * * *

UNITED STATES PATENT AND TRADEMARK OFFICE
CERTIFICATE OF CORRECTION

PATENT NO. : 6,821,341 B2  
APPLICATION NO. : 09/908052  
DATED : November 23, 2004  
INVENTOR(S) : Vaartstra Page 1 of 1

It is certified that error appears in the above-identified patent and that said Letters Patent is hereby corrected as shown below:

On the title page, field (63), please delete ", and a continuation of application No. 08/720,710, filed on Oct. 2, 1996, now Pat. No. 6,244,575."

In column 1, lines 7-9, please delete "This is also a continuation of application Ser. No. 08/720,710, filed on Oct. 2, 1996, now U.S. Pat. No. 6,244,575 which is incorporated herein by reference in its entirety."

Please substitute the printed abstract and specification with the attached abstract and specification.

Signed and Sealed this

Fifth Day of February, 2008

JON W. DUDAS  
*Director of the United States Patent and Trademark Office*